(12) United States Patent
Groe et al.

(10) Patent No.: US 7,479,815 B1
(45) Date of Patent: Jan. 20, 2009

(54) PLL WITH DUAL EDGE SENSITIVITY

(75) Inventors: John B. Groe, Poway, CA (US); Paul Lawrence Viani, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

(21) Appl. No.: 11/367,023

(22) Filed: Mar. 1, 2006

Related U.S. Application Data

(60) Provisional application No. 60/657,833, filed on Mar. 1, 2005.

(51) Int. Cl.
*H03L 7/06* (2006.01)

(52) U.S. Cl. .................. 327/156; 327/117; 327/160

(58) Field of Classification Search .......... 327/115, 327/117, 147, 148, 156, 157, 160; 331/34, 331/DIG. 2, 25, 17; 377/47–48, 52; 375/373–376
See application file for complete search history.

(56) References Cited

U.S. PATENT DOCUMENTS

| | | | |
|---|---|---|---|
| 4,263,560 A | 4/1981 | Ricker | |
| 4,430,627 A | 2/1984 | Machida | |
| 4,769,588 A | 9/1988 | Panther | |
| 4,816,772 A | 3/1989 | Klotz | |
| 4,926,135 A | 5/1990 | Voorman | |
| 4,965,531 A | 10/1990 | Riley | |
| 5,006,818 A | 4/1991 | Koyama et al. | |
| 5,015,968 A | 5/1991 | Podell et al. | |
| 5,030,923 A | 7/1991 | Arai | |
| 5,289,136 A | 2/1994 | DeVeirman et al. | |
| 5,331,292 A | 7/1994 | Worden et al. | |
| 5,399,990 A | 3/1995 | Miyake | |
| 5,491,450 A | 2/1996 | Helms et al. | |
| 5,508,660 A | 4/1996 | Gersbach et al. | |
| 5,548,594 A | 8/1996 | Nakamura | |
| 5,561,385 A | 10/1996 | Choi | |
| 5,581,216 A | 12/1996 | Ruetz | |
| 5,631,587 A | 5/1997 | Co et al. | |
| 5,648,744 A | 7/1997 | Prakash et al. | |
| 5,677,646 A | 10/1997 | Entrikin | |
| 5,739,730 A | 4/1998 | Rotzoll | |
| 5,767,748 A | 6/1998 | Nakao | |
| 5,818,303 A | 10/1998 | Oishi et al. | |
| 5,834,987 A | 11/1998 | Dent | |
| 5,862,465 A | 1/1999 | Ou | |
| 5,878,101 A * | 3/1999 | Aisaka | 377/47 |
| 5,880,631 A | 3/1999 | Sahota | |

(Continued)

*Primary Examiner*—Kenneth B Wells
*Assistant Examiner*—Ryan C Jager
(74) *Attorney, Agent, or Firm*—Cooley Godward Kronish LLP

(57) ABSTRACT

A divider apparatus for use within a phase-locked loop having an output terminal at which an output frequency is produced. The apparatus includes a prescalar circuit configured to produce a prescaled signal by dividing the output frequency in response to a mode select signal. A first programmable counter is disposed to receive the prescaled signal and to produce the mode select signal. In addition, a second programmable counter is disposed to receive the prescaled signal and to produce a divided signal utilized by the phase-locked loop. The apparatus further includes a control circuit connected to the first programmable counter and to the second programmable counter, the control circuit providing a first resynchronization signal to the first programmable counter and a second resynchronization signal to the second programmable counter.

7 Claims, 21 Drawing Sheets

U.S. PATENT DOCUMENTS

| | | | |
|---|---|---|---|
| 5,939,922 | A | 8/1999 | Umeda |
| 5,945,855 | A | 8/1999 | Momtaz |
| 5,949,286 | A | 9/1999 | Jones |
| 5,990,740 | A | 11/1999 | Groe |
| 5,994,959 | A | 11/1999 | Ainsworth |
| 5,999,056 | A | 12/1999 | Fong |
| 6,011,437 | A | 1/2000 | Sutardja et al. |
| 6,018,651 | A | 1/2000 | Bruckert et al. |
| 6,031,425 | A * | 2/2000 | Hasegawa .................. 331/1 A |
| 6,044,124 | A | 3/2000 | Monahan et al. |
| 6,052,035 | A | 4/2000 | Nolan et al. |
| 6,057,739 | A | 5/2000 | Crowley et al. |
| 6,060,935 | A | 5/2000 | Shulman |
| 6,091,307 | A | 7/2000 | Nelson |
| 6,100,767 | A | 8/2000 | Sumi |
| 6,114,920 | A | 9/2000 | Moon et al. |
| 6,163,207 | A | 12/2000 | Kattner et al. |
| 6,173,011 | B1 | 1/2001 | Rey et al. |
| 6,191,956 | B1 | 2/2001 | Foreman |
| 6,204,728 | B1 | 3/2001 | Hageraats |
| 6,211,737 | B1 | 4/2001 | Fong |
| 6,229,374 | B1 | 5/2001 | Tammone, Jr. |
| 6,246,289 | B1 | 6/2001 | Pisati et al. |
| 6,255,889 | B1 | 7/2001 | Branson |
| 6,259,321 | B1 | 7/2001 | Song et al. |
| 6,288,609 | B1 | 9/2001 | Brueske et al. |
| 6,298,093 | B1 | 10/2001 | Genrich |
| 6,333,675 | B1 | 12/2001 | Saito |
| 6,370,372 | B1 | 4/2002 | Molnar et al. |
| 6,392,487 | B1 | 5/2002 | Alexanian |
| 6,404,252 | B1 | 6/2002 | Wilsch |
| 6,476,660 | B1 | 11/2002 | Visocchi et al. |
| 6,515,553 | B1 | 2/2003 | Filiol et al. |
| 6,559,717 | B1 | 5/2003 | Lynn et al. |
| 6,560,448 | B1 | 5/2003 | Baldwin et al. |
| 6,571,083 | B1 | 5/2003 | Powell, II et al. |
| 6,577,190 | B2 | 6/2003 | Kim |
| 6,583,671 | B2 | 6/2003 | Chatwin |
| 6,583,675 | B2 | 6/2003 | Gomez |
| 6,639,474 | B2 | 10/2003 | Asikainen et al. |
| 6,664,865 | B2 | 12/2003 | Groe et al. |
| 6,683,509 | B2 | 1/2004 | Albon et al. |
| 6,693,977 | B2 | 2/2004 | Katayama et al. |
| 6,703,887 | B2 | 3/2004 | Groe |
| 6,711,391 | B1 | 3/2004 | Walker et al. |
| 6,724,235 | B2 | 4/2004 | Costa et al. |
| 6,734,736 | B2 | 5/2004 | Gharpurey |
| 6,744,319 | B2 | 6/2004 | Kim |
| 6,751,272 | B1 | 6/2004 | Burns et al. |
| 6,753,738 | B1 | 6/2004 | Baird |
| 6,763,228 | B2 | 7/2004 | Prentice et al. |
| 6,774,740 | B1 | 8/2004 | Groe |
| 6,777,999 | B2 | 8/2004 | Kanou et al. |
| 6,781,425 | B2 | 8/2004 | Si |
| 6,795,843 | B1 | 9/2004 | Groe |
| 6,798,290 | B2 | 9/2004 | Groe et al. |
| 6,801,089 | B2 | 10/2004 | Costa et al. |
| 6,845,139 | B2 * | 1/2005 | Gibbons ...................... 377/47 |
| 6,856,205 | B1 | 2/2005 | Groe |
| 6,870,411 | B2 | 3/2005 | Shibahara et al. |
| 6,917,791 | B2 | 7/2005 | Chadwick |
| 6,940,356 | B2 | 9/2005 | McDonald, II et al. |
| 6,943,600 | B2 | 9/2005 | Craninckx |
| 6,975,687 | B2 | 12/2005 | Jackson et al. |
| 6,985,703 | B2 | 1/2006 | Groe et al. |
| 6,990,327 | B2 | 1/2006 | Zheng et al. |
| 7,062,248 | B2 | 6/2006 | Kuiri |
| 7,065,334 | B1 | 6/2006 | Otaka et al. |
| 7,088,979 | B1 | 8/2006 | Shenoy et al. |
| 7,123,102 | B2 | 10/2006 | Uozumi et al. |
| 7,142,062 | B2 | 11/2006 | Vaananen et al. |
| 7,148,764 | B2 | 12/2006 | Kasahara et al. |
| 7,171,170 | B2 | 1/2007 | Groe et al. |
| 7,215,215 | B2 | 5/2007 | Hirano et al. |
| 2002/0071497 | A1 | 6/2002 | Bengtsson et al. |
| 2002/0193009 | A1 | 12/2002 | Reed |
| 2003/0078016 | A1 | 4/2003 | Groe et al. |
| 2003/0092405 | A1 | 5/2003 | Groe et al. |
| 2003/0118143 | A1 | 6/2003 | Bellaouar et al. |
| 2003/0197564 | A1 | 10/2003 | Humphreys et al. |
| 2004/0017852 | A1 | 1/2004 | Redman-White |
| 2004/0051590 | A1 | 3/2004 | Perrott et al. |
| 2005/0093631 | A1 | 5/2005 | Groe |
| 2005/0099232 | A1 | 5/2005 | Groe et al. |

* cited by examiner

PLL WITH DUAL EDGE SENSITIVITY

CROSS-REFERENCE TO RELATED APPLICATIONS

This application claims priority under 35 U.S.C. §119(e) to U.S. provisional application Ser. No. 60/657,833, entitled PLL WITH DUAL EDGE SENSITIVITY, filed Mar. 1, 2005, which is hereby incorporated by reference. This application is also related to U.S. Pat. No. 6,856,205, entitled VCO WITH AUTOMATIC CALIBRATION, which is hereby incorporated by reference.

FIELD OF THE INVENTION

The present invention relates generally to phase locked loops used as frequency synthesizers, and more particularly, to phase-locked loop that operate to reduce acquisition time.

BACKGROUND OF THE INVENTION

More and more communication systems support multiple standards and protocols. These systems rely on compressed operating modes that divide timing frames into sub periods and assign these periods to different protocols. The sub periods allow probing and setting up of new communication links. These require an advanced radio transceiver and, more often than not, duplicate frequency synthesizers to support fast switching.

Frequency synthesizers based on phase-locked loops (PLL) use a feedback loop to create an agile, low-noise signal. The feedback loop helps to minimize noise in track mode but tends to increase the switching time in acquisition mode, making it difficult to optimize the phase-locked loop's overall performance. As such, it would therefore be advantageous to adjust the parameters associated with the phase-locked loop and optimize them according to its mode of operation.

SUMMARY OF THE INVENTION

The present invention provides a method and apparatus capable of reducing the switching and settling time of a phase-locked loop, thereby enabling its performance to be optimized for a variety of applications.

In one aspect the present invention relates to a divider apparatus for use within a phase-locked loop having an output terminal at which an output frequency is produced. The apparatus includes a prescalar circuit configured to produce a prescaled signal by dividing the output frequency in accordance with a defined divider value. The prescalar circuit includes at least a resynchronization element and a prescalar front-end configured to generate an intermediate signal characterized by a 50% duty cycle. The apparatus further includes a first programmable counter operatively connected to an output of the prescalar circuit, and a second programmable counter disposed to receive the prescaled signal and to produce a divided signal utilized within the phase-locked loop.

In another aspect the present invention pertains to a divider apparatus for use within a phase-locked loop having an output terminal at which an output frequency is produced. The apparatus includes a prescalar circuit configured to produce a prescaled signal by dividing the output frequency in response to a mode select signal. A first programmable counter is disposed to receive the prescaled signal and to produce the mode select signal. In addition, a second programmable counter is disposed to receive the prescaled signal and to produce a divided signal utilized by the phase-locked loop.

The apparatus further includes a control circuit connected to the first programmable counter and to the second programmable counter, the control circuit providing a first resynchronization signal to the first programmable counter and a second resynchronization signal to the second programmable counter.

In yet another aspect the present invention is directed to a signal frequency division method for use within a phase-locked loop having an output terminal at which an output frequency is produced. The method includes dividing the output frequency in accordance with a defined divider value so as to produce a prescaled signal wherein the dividing includes generating, in accordance with a mode select signal, an intermediate signal characterized by a 50% duty cycle. The method further includes generating the mode select signal based upon the prescaled signal. Counting operations are performed using the prescaled signal so as to produce a divided signal utilized within the phase-locked loop.

The present invention also generally relates to a phase-locked loop module having a voltage-controlled oscillator for generating an output signal of a frequency determined by a control voltage. A divider circuit divides the output signal to produce a frequency-divided signal, the divider including a prescalar circuit configured to produce a prescaled signal by dividing the frequency of the output signal in accordance with a defined divider value wherein the prescalar circuit includes at least a resynchronization element and a prescalar front-end configured to generate an intermediate signal characterized by a 50% duty cycle. The module further includes a phase/frequency detector disposed to compare phases between an input reference signal and the frequency-divided signal and to produce a phase error signal. A charge pump circuit produces a charge pump signal in response to the phase error signal. A loop filter then produces the control voltage in response to the charge pump signal.

Another aspect of the invention is directed to a phase-locked loop module having a voltage-controlled oscillator for generating an output signal of a frequency determined by a control voltage. A divider circuit divides the output signal to produce a frequency-divided signal, the divider including a prescalar circuit configured to produce a prescaled signal by dividing the frequency of the output signal, a first programmable counter and a second programmable counter connected to an output of the prescalar circuit, and a control circuit operatively coupled to the first programmable counter and the second programmable counter. The module further includes a phase/frequency detector disposed to compare phases between an input reference signal and the frequency-divided signal and to produce a phase error signal. A charge pump circuit produces a charge pump signal in response to the phase error signal. A loop filter then produces the control voltage in response to the charge pump signal.

BRIEF DESCRIPTION OF THE DRAWINGS

For a better understanding of the nature of the features of the invention, reference should be made to the following detailed description taken in conjunction with the accompanying drawings, in which.

DETAILED DESCRIPTION OF EMBODIMENTS OF THE INVENTION

Figure 1:
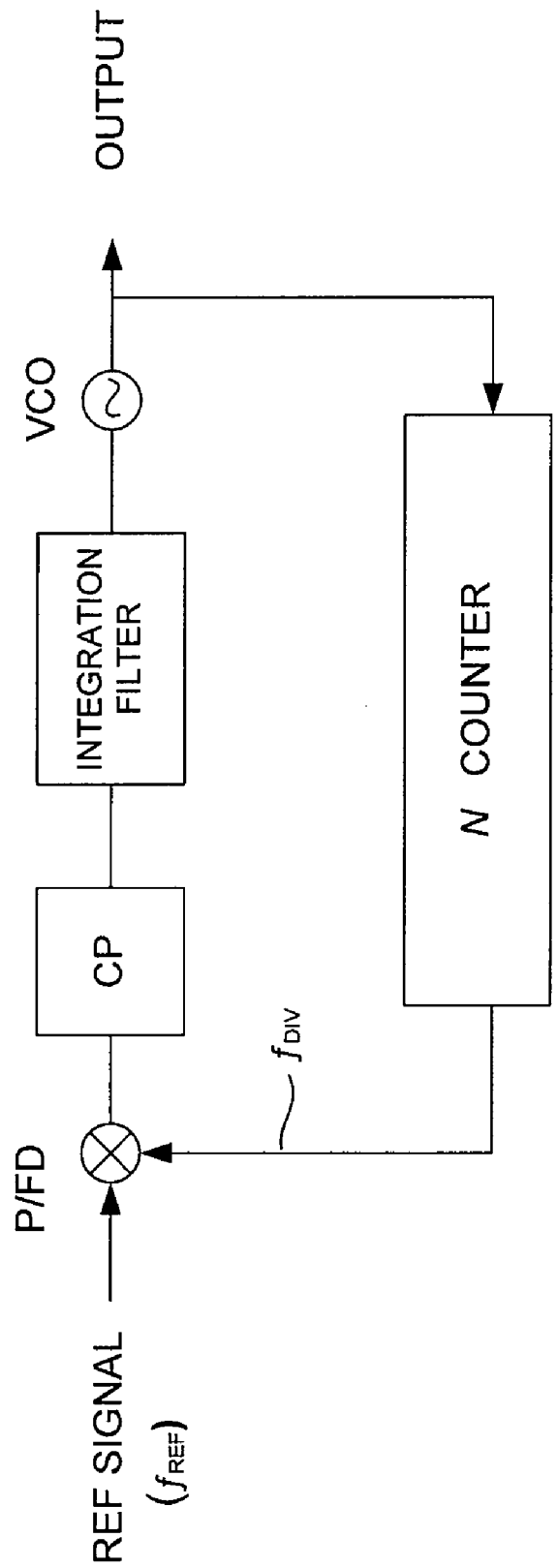
FIG. 1 shows a diagram of a standard phase-locked loop.

A conventional phase-locked loop (PLL) used to synthesize signals at radio frequencies is shown in FIG. 1. It consists of a voltage-controlled oscillator (VCO), N counter, phase/frequency detector (P/FD), charge pump (CP), and integration filter.

The phase-locked loop incorporates feedback that minimizes the phase difference between a very accurate reference signal and the output signal. It operates to generate an output signal at a frequency given by $$f_{VCO} = N f_{REF}$$

where $f_{vco}$ is the frequency of the output signal produced by the VCO, N is the value of the feedback counter, and $f_{REF}$ is the frequency of the reference signal. Note that the frequency resolution or equivalently the minimum frequency step ($\Delta f$) is simply $f_{REF}$ for an integer-N phase-locked loop.

Figure 2:
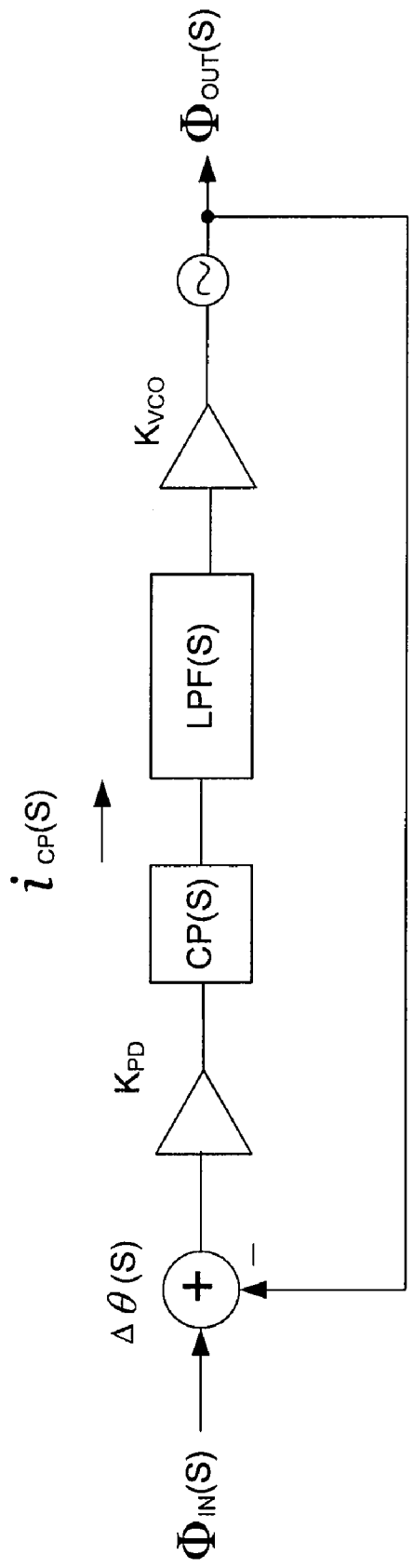
FIG. 2 shows a mathematical model of a conventional PLL.
Figure 3:
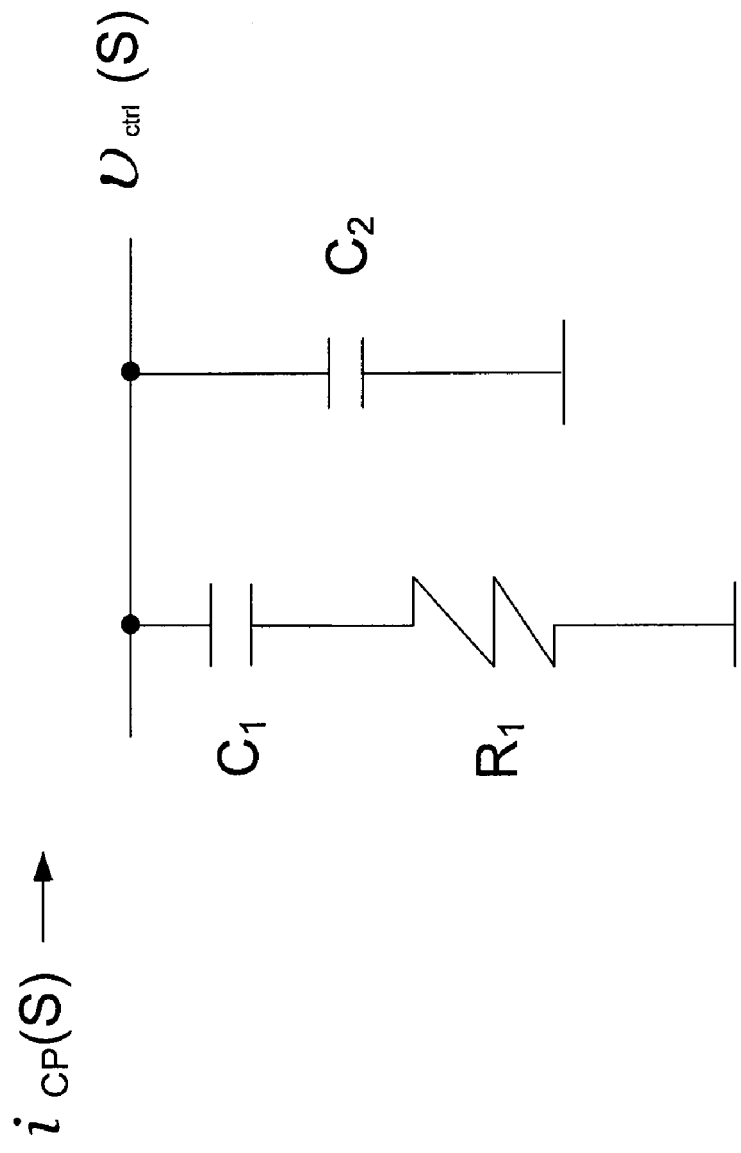
FIG. 3 shows a diagram of a passive low pass filter or integration filter.

A mathematical model of the PLL is shown in FIG. 2. The voltage-controlled oscillator produces an output signal at a frequency set by the control voltage $v_{ctrl}$ according to $$v_{out}(t) = A_c \cos(\omega_{free} t + K_{vco} \int v_{ctrl}(t) dt)$$

where $\omega_{free}$ is the free-running frequency of the oscillator and $K_{vco}$ is its associated gain. The gain $K_{vco}$ describes the relationship between the excess phase of the carrier $\Phi_{out}(s)$ and the control voltage $v_{ctrl}$ $$\frac{\Phi_{out}(s)}{v_{ctrl}(s)} = \frac{K_{vco}}{s}$$

where $K_{vco}$ is in rads/V. The N counter simply divides the output phase $\Phi_{out}(s)$ by N. When the phase-locked loop is locked, the phase detector and charge pump circuits generate an output signal $i_{CP}(s)$ that is proportional to the phase difference $\Delta\theta$ between its two input signals (the reference signal REF and the divider output signal DIV). The signal $i_{CP}(s)$ shifts positive to advance the VCO frequency and phase while it shifts negative to slow the VCO signal. The output signal $i_{CP}(s)$ can therefore be expressed as $$i_{CP}(s) = K_{pd} \frac{\Delta\theta(s)}{2\pi}$$

where $K_{pd}$ is in A/radians and $\Delta\theta$ is in radians. A simple integration filter, consisting of resistor $R_1$ and capacitors $C_1$-$C_2$ as shown in FIG. 3, transforms the output signal $i_{CP}(s)$ to the control voltage $v_{ctrl}$ as follows $$v_{ctrl}(s) = i_{out}(s)\left(\frac{sR_1C_1 + 1}{s^2 R_1 C_1 C_2 + s(C_1 + C_2)}\right)$$

where a zero (at $1/R_1C_1$) has been added to stabilize the second order system and the capacitor $C_2$ has been included to reduce any ripple on the output voltage. Combining the above relations yields the composite open-loop transfer function $$GH(s) = K_{PD} K_{VCO} \frac{1}{s}\left(\frac{sR_1C_1 + 1}{sR_1C_1C_2 + C_1 + C_2}\right)$$

which has two poles at the origin (due to the voltage-controlled oscillator and the integration filter). This system is referred to as a type II phase-locked loop.

Figure 4:
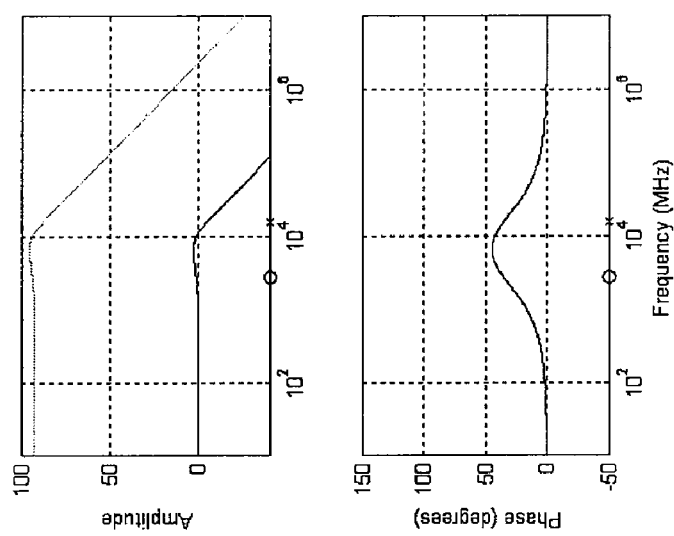
FIG. 4 illustrates the PLL's open-loop transfer function.

The open-loop transfer function GH(s) is used to analyze the stability of the feedback loop. Its magnitude and phase response—shown in FIG. 4—indicate the phase margin of the system. Ideally, the phase margin approaches 45°, providing a loop with adequate stability while minimizing acquisition time.

The closed-loop response of the system is simply $$T(s) = \frac{NK_{PD}K_{VCO}(sR_1C_1 + 1)}{s^2 NR_1C_1C_2 + s[N(C_1+C_2) + K_{PD}K_{VCO}R_1C_1] + K_{PD}K_{VCO}}$$

which shows the zero and two complex poles. Not surprisingly, both the open-loop and closed-loop responses of the phase-locked loop depend on the integration filter components ($R_1$, $C_1$-$C_2$), the charge pump current $I_{CP}$, and the gain of the voltage-controlled oscillator, $K_{vco}$. Mapping the denominator of the above expression to the characteristic equation of a second order system reveals $$s^2 NR_1C_1C_2 + s[N(C_1+C_2) + K_{PD}K_{VCO}R_1C_1] + K_{PD}K_{VCO} = s^2 + 2\zeta\omega_n s + \omega_n^2$$

with the critical frequency $\omega_n$ equal to $$\omega_n = \sqrt{\frac{K_{PD}K_{VCO}}{NR_1C_1C_2}}$$

and the damping factor $\zeta$ given by $$\zeta = \frac{1}{\omega_n} \frac{N(C_1+C_2) + K_{PD}K_{VCO}R_1C_1}{NR_1C_1C_2}$$

Note that the damping factor is usually set to 0.707—the condition for critical damping and 45° phase margin.

The step response of the PLL second order system in essence determines the acquisition time $t_{acq}$ of the frequency synthesizer. As such, it depends on the above PLL parameters ($\omega_n$ and $\zeta$) as well as the programmed step size ($\Delta f$) and required settling accuracy ($\alpha$), with $$t_{acq} \approx \frac{1}{\omega_n} \ln \frac{\Delta f}{f_{VCO} \alpha \sqrt{1-\zeta^2}}$$

where $f_{VCO}$ is the initial frequency. From this relationship it's clear that the critical frequency $\omega_n$ sets the PLL's settling time. It follows then that to reduce settling time, the critical frequency must be increased. This can be accomplished by increasing the charge pump current $i_{CP}$, reducing the $R_1C_1$ product, reducing N, or any combination thereof.

Figure 5:
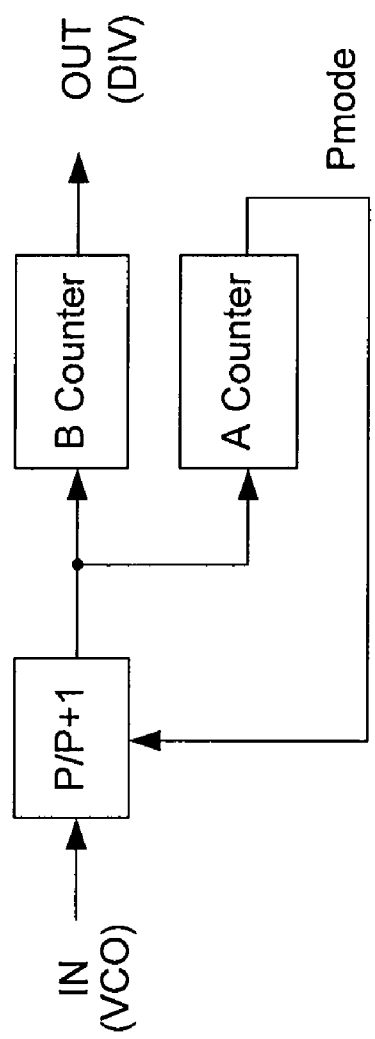
FIG. 5 shows a block diagram of the N counter.

The step response of the phase-locked loop and the corresponding switching behavior are both dynamic and discrete. This is primarily due to the phase/frequency detector. It compares the reference signal REF and N counter output signal DIV. (Note the N counter essentially divides the phase of the VCO signal.) In practice, the N counter is a swallow counter such as the one shown in FIG. 5. It consists of a dual-modulus prescalar and two programmable counters (labeled A and B). The A counter directs the dual-modulus prescalar to count either P or P+1 cycles of the VCO signal. The B counter, with a value greater than the A counter, pulses the output signal DIV every N cycles of the VCO signal, with $N=A(P+1)+(B-A)P$ which simplifies to $N=BP+A$ The architecture of the swallow counter allows the value of N to change in steps of one via the A counter value.

Figure 6A:
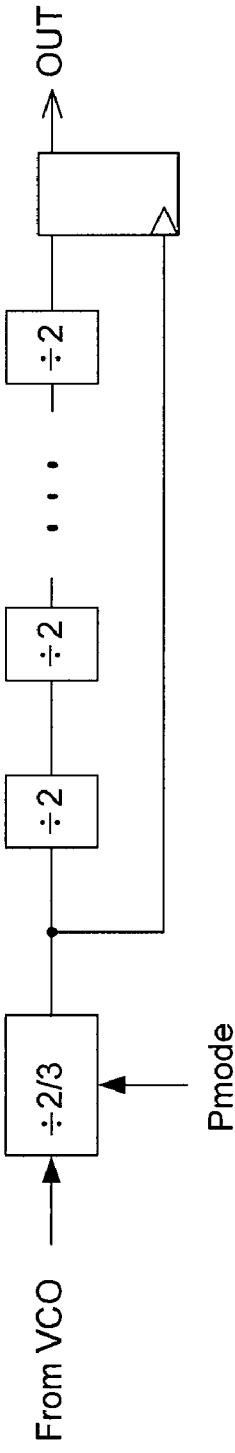
FIG. 6 shows a conventional prescalar front-end.
Figure 6B:
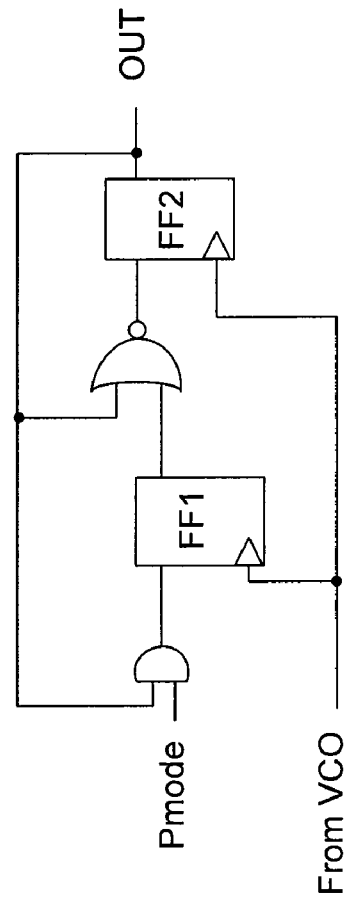

The dual-modulus prescalar is formed using a divide-by-2/divide-by-3 front-end and-successive divide-by-2 stages as shown in FIG. 6a. The divide-by-2/divide-by-3 front-end shown in FIG. 6b operates as follows. With the mode input LO, the output of the first flip-flop (FF1) is forced and held LO. This effectively converts the NOR gate into a simple inverter and the second flip-flop (FF2) into a divide-by-2 circuit. As a result, FF2 produces a pulse every other clock cycle.

Figure 6C:
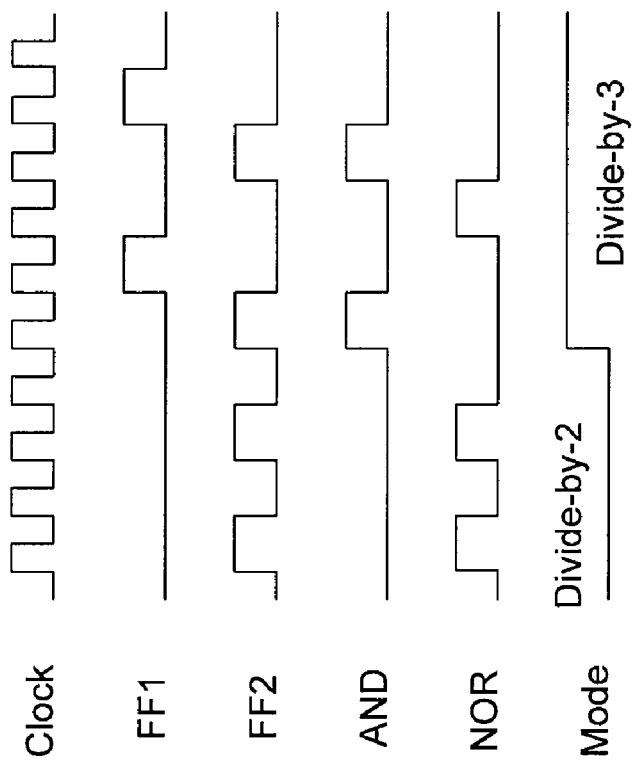

With the mode input HI, the AND gate is forced to follow the output of FF2. The resulting signal is delayed by FF1 (by one clock cycle) to keep the output of the NOR gate LO for two clock cycles. As a result, the output of FF2 pulses HI every third cycle of the clock signal and lacks symmetry as seen in the timing diagram of FIG. 6c.

Figures 7A, 7B:
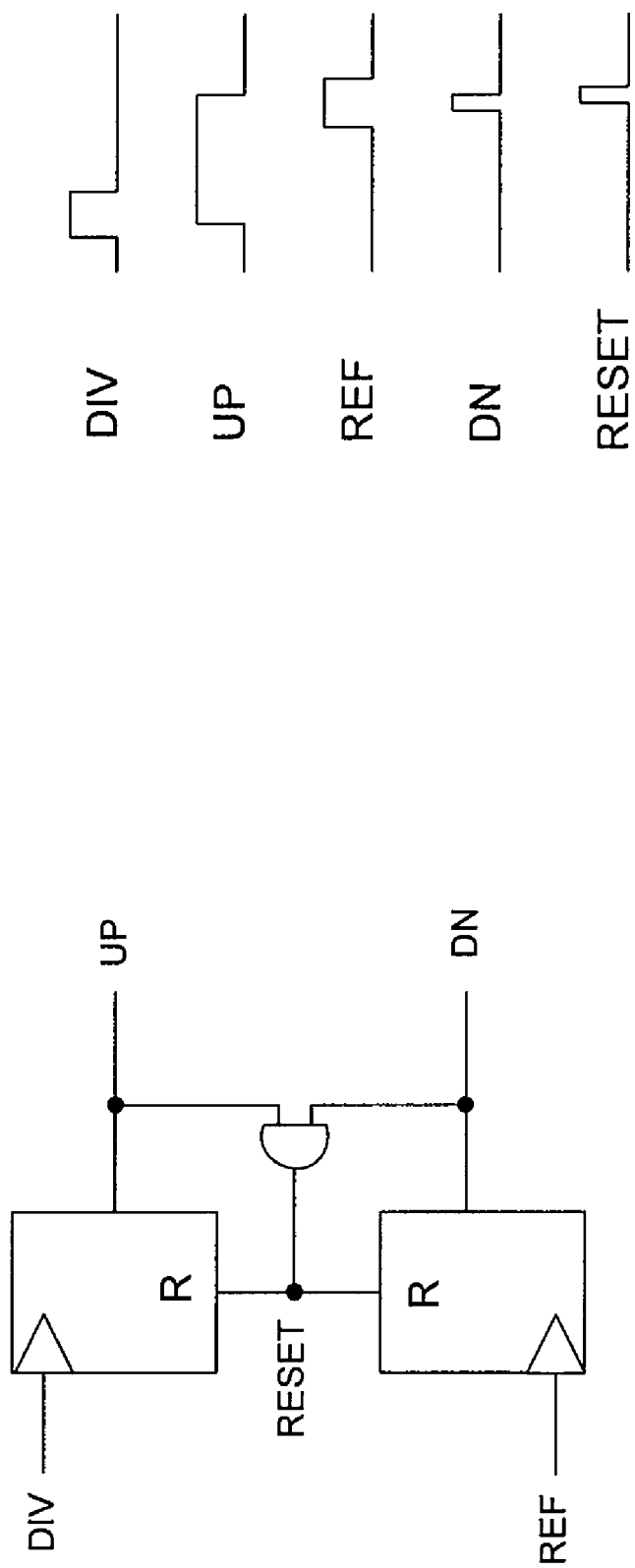
FIG. 7 illustrates the phase/frequency detector and its operation.

To operate properly, the phase/frequency detector triggers only on the leading edges of REF and DIV signals to generate an output signal proportional to their phase difference $\Delta\theta$. This allows a digital circuit such as the one shown in FIG. 7a to be used. The circuit consists of two edge-triggered flip-flops and an AND gate. The first leading edge applied to the phase/frequency detector drives its associated flip-flop's output HI. This output remains at this level until the leading edge of the opposite signal drives the other flip-flop HI. At this point, the AND gate resets both flip-flops as shown in FIG. 7b. Note that the non-zero propagation delay of the AND gate causes both outputs to remain HI for a short period, which helps avoid dead zone issues that plague other phase/frequency detectors. It follows that the UP and DN signals indicate which leading edge occurred first while the width of the output signal corresponds to the timing and consequently the phase difference between the REF and DIV signals.

Figure 8:
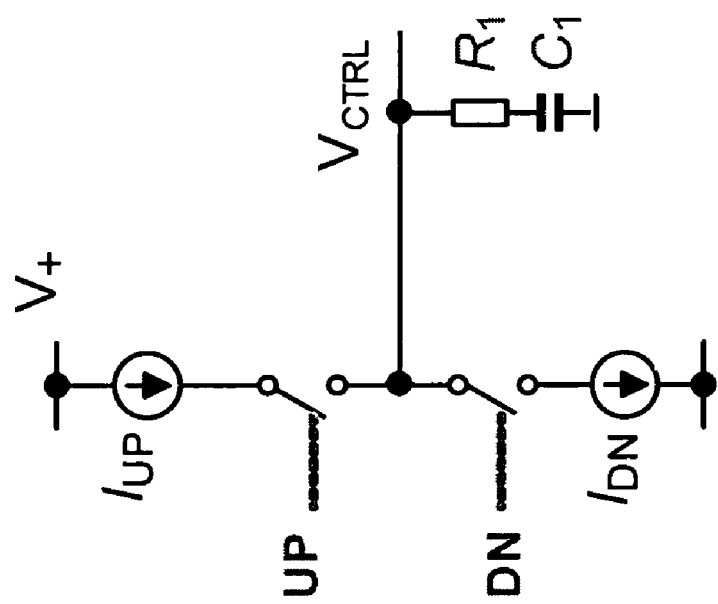
FIG. 8 provides a schematic representation of the integration filter.

The UP and DN pulses drive the charge pump circuit and feed the integration filter shown in FIG. 8. The charge pump operates in one of four states—pump up, pump down, tristate, and off—related to the UP and DN signals produced by the phase/frequency detector. An active UP signal directs the charge pump to source charge to the integration filter and increase or pump up the control voltage $v_{ctrl}$. An active DN signal sinks charge from the integration filter and decreases or pumps down the control voltage $v_{ctrl}$. When both the UP and DN signals are active, the charge pump is tristate. Lastly, with neither phase/frequency detector output active, the charge pump is off.

The charge pump sources or sinks charge ($i_{CP}\Delta t$) to or from the integration filter and thereby moves the control voltage $v_{ctrl}$ applied to the VCO. This in turn shifts the frequency and phase of the VCO until the phase of the DIV signal (output of the N counter) aligns with the phase of the reference signal REF. Note that it takes a finite time to accumulate enough charge to move the control voltage appropriately.

The charge pump directs charge to or from the integration filter with each UP and DN pulse created by the phase/frequency detector. In practice, these pulses align with the leading edge of the reference and divided signals (REF and DIV).

Figure 9:
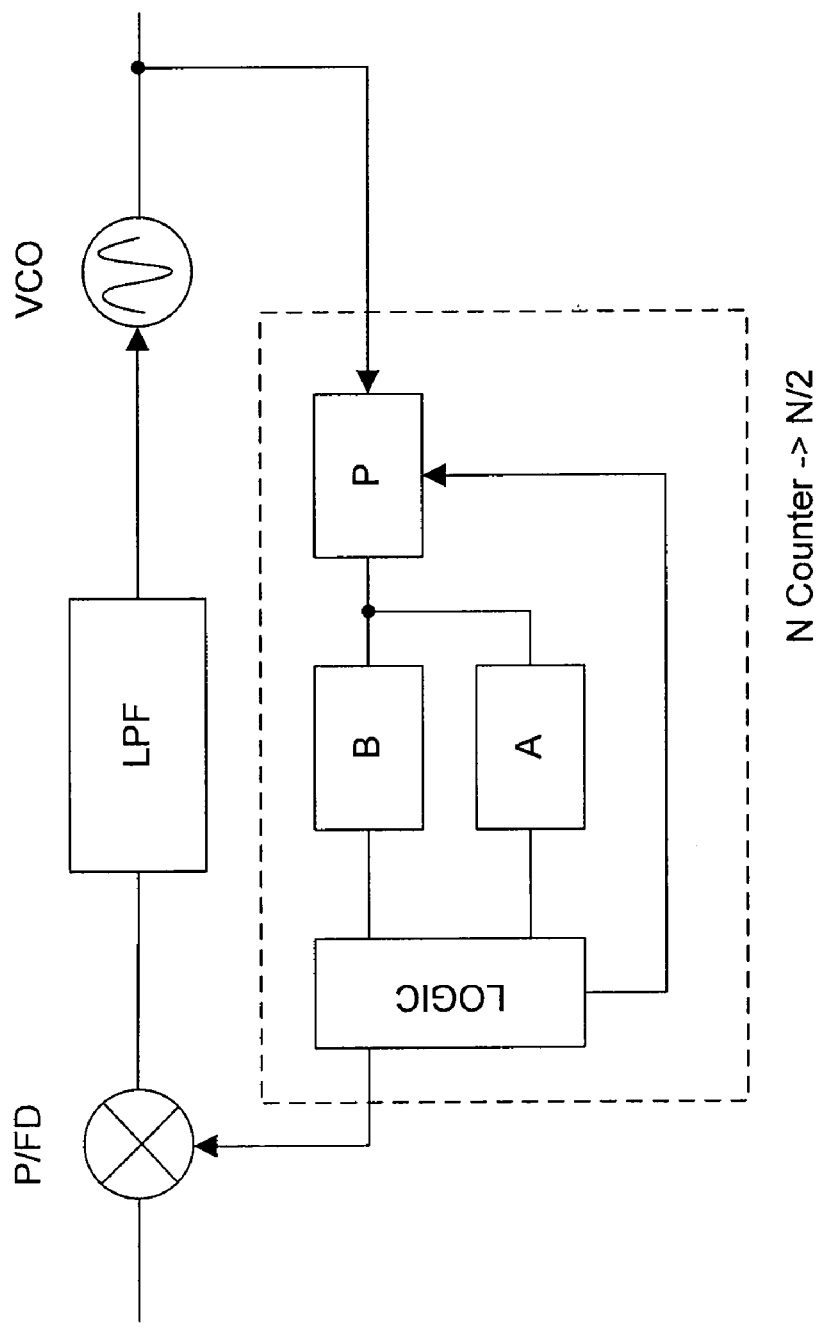
FIG. 9 shows a novel PLL system with dual edge sensitivity in accordance with the present invention.
Figure 10:
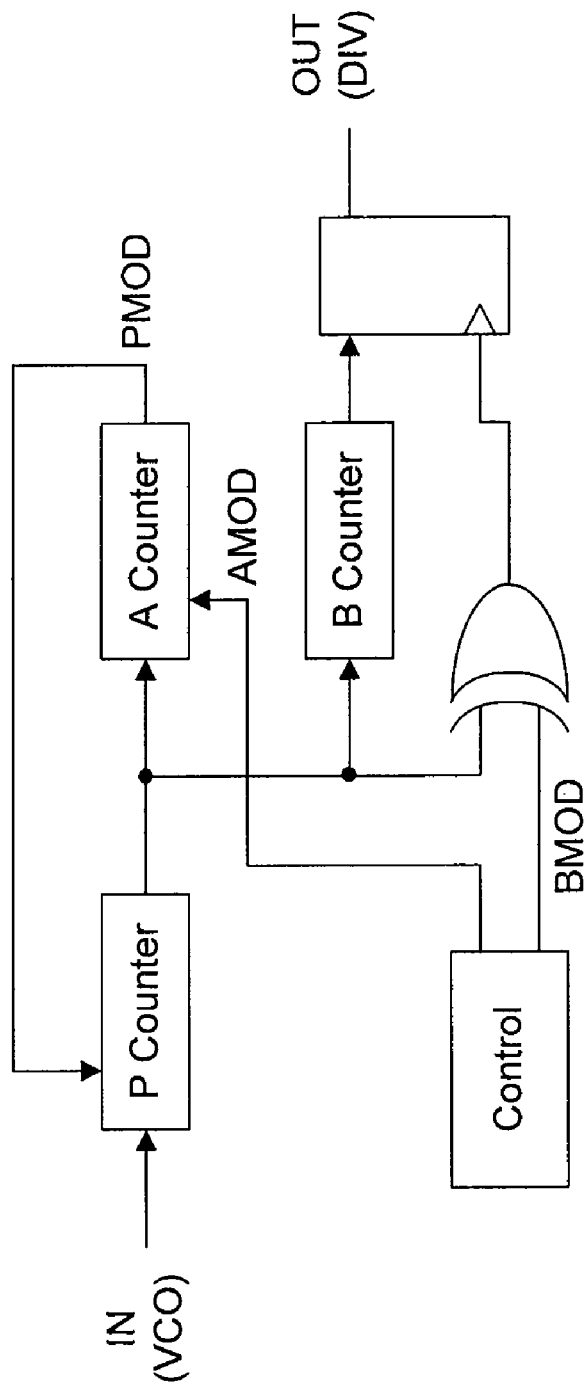
FIG. 10 shows a novel N counter in accordance with the present invention.

The inventive PLL system shown in FIG. 9 reduces acquisition time by detecting both the leading and trailing edges of the VCO signal. It accomplishes this with a novel N counter (shown in FIG. 10) that generates an output signal DIV triggered by either edge of the VCO signal. Since the PLL system detects both the leading and trailing edges of the VCO signal, the value of N can be halved without losing frequency resolution ($\Delta f$) in the PLL. This effectively doubles the critical frequency $\omega_n$ and thus dramatically reduces the acquisition time $t_{acq}$.

Figure 11A:
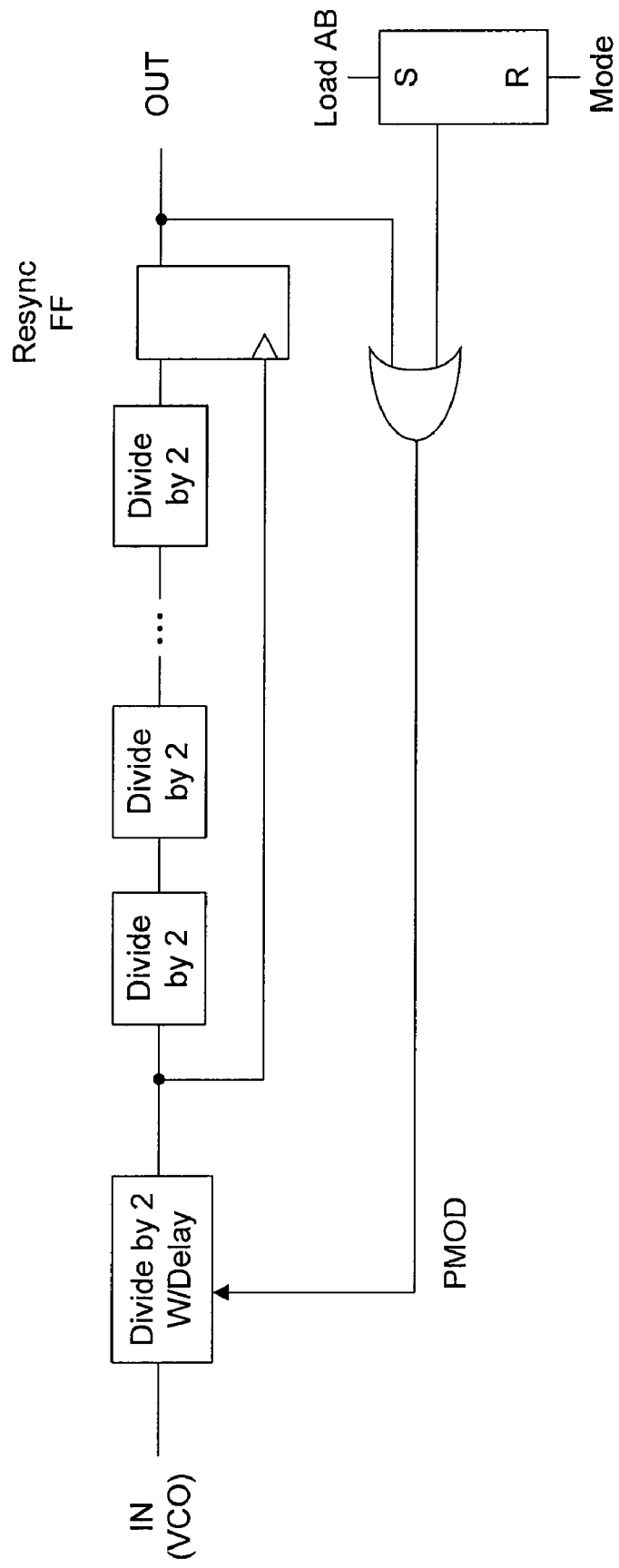
FIG. 11 shows a detailed diagram of a modified prescalar front-end in accordance with the present invention.

At the heart of the novel N counter is a new prescalar front-end with 50% duty cycle. It's shown in FIG. 11a and advantageously produces a 50% duty cycle for both even and odd values of P. The circuit nominally generates a divide-by-2 output signal and optionally adds a half-cycle delay, depending on the control signal PMOD (prescalar mode). This signal transitions HI to extend the output pulse in divide-by-three mode and thereby become symmetric.

Figure 11B:
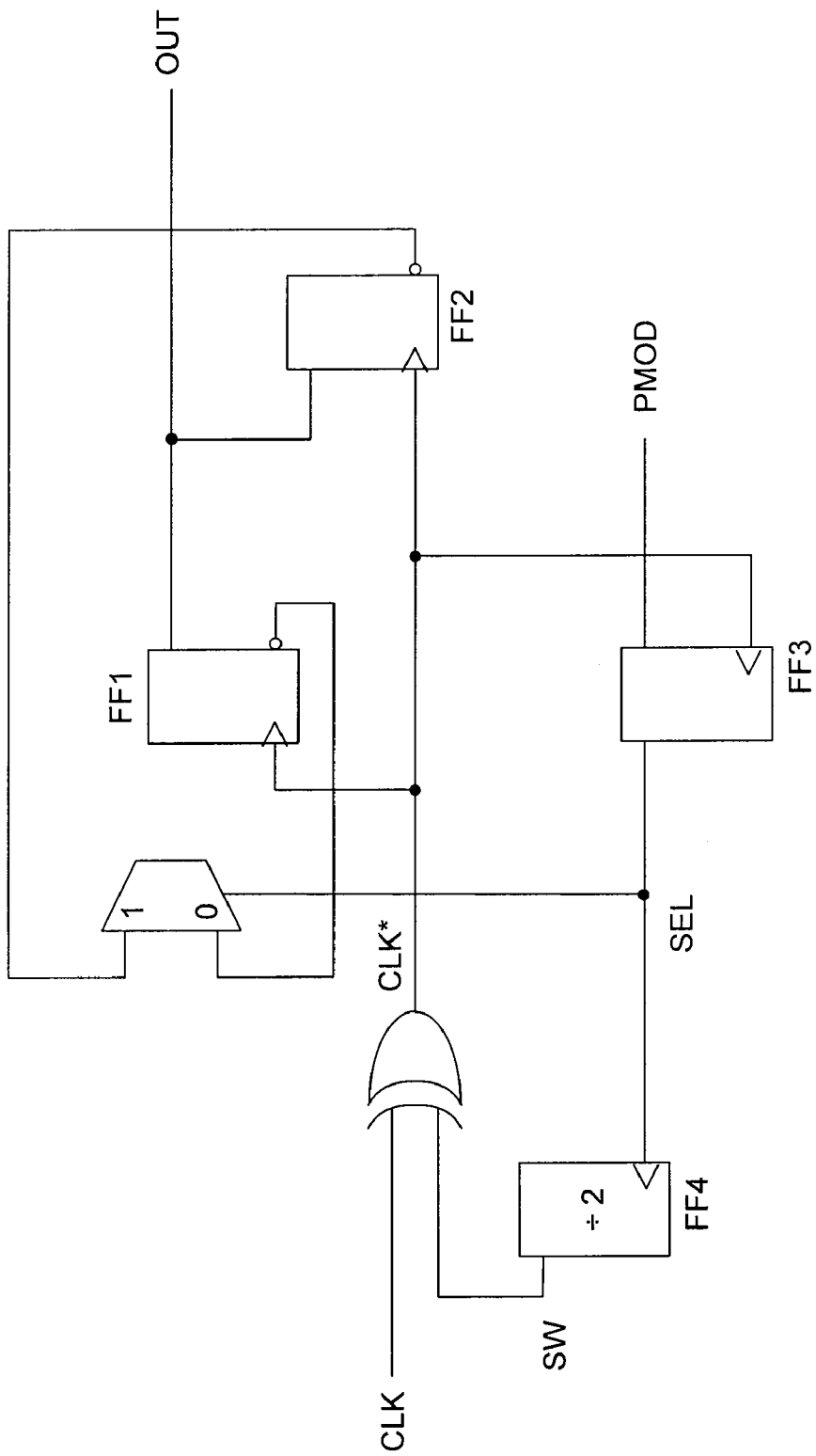
Figure 11C:
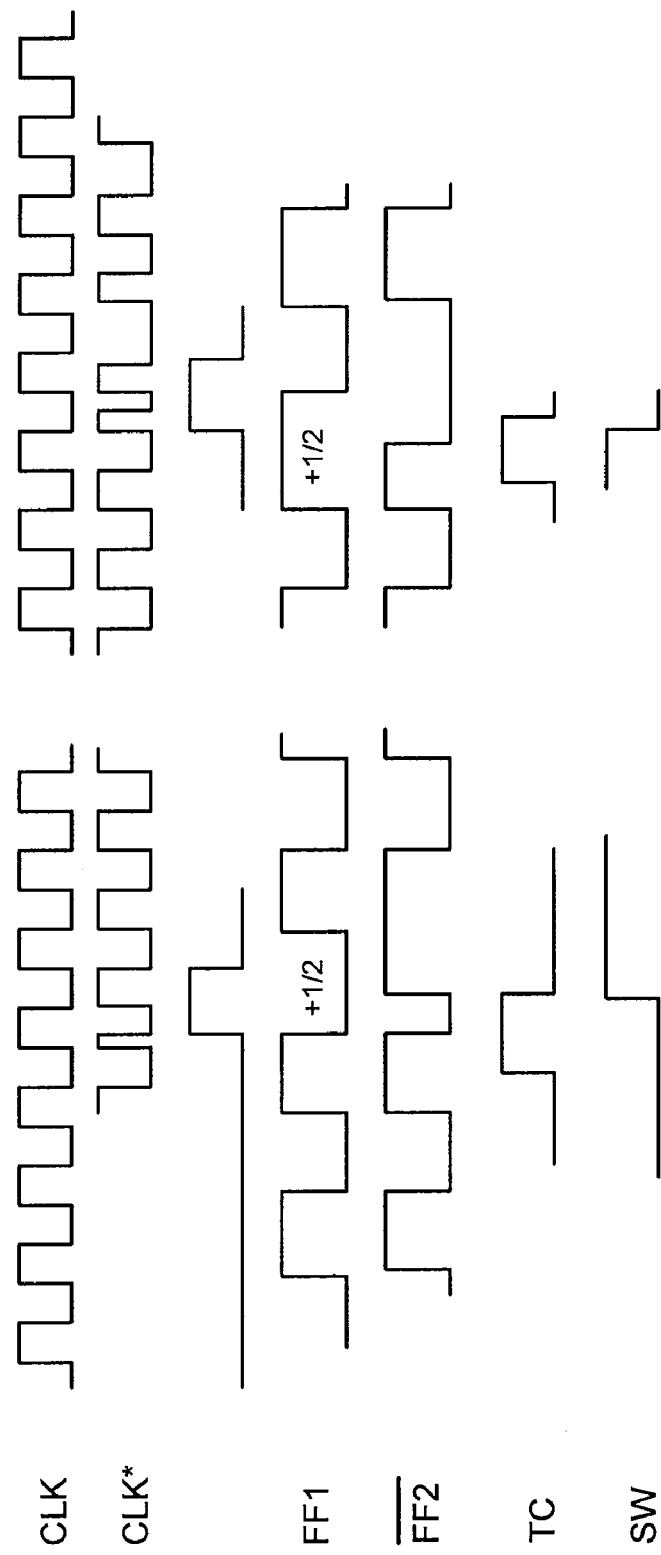

A detailed view of the divide-by-2 circuit with selectable delay is shown in FIG. 11b. The latch FF3 captures the PMOD signal and uses it as the SEL signal. With the PMOD and SEL signals LO, the MUX configures FF1 as a divide-by-2 circuit. With the PMOD input HI, the latch FF3 switches its output SEL to HI. This toggles FF4, which in turn directs the XOR gate to invert the CLK signal. In parallel, the SEL signal switches the MUX to route the output of FF2 to the input of FF1. Since the output of FF2 is the output of FF1 delayed by one cycle—the output of FF1 is held an extra cycle. The next CLK edge resets FF3 and switches SEL to LO again. Since the CLK signal gets inverted, it produces just a half-cycle of delay in the output signal as shown in FIG. 11c.

Figure 11D:
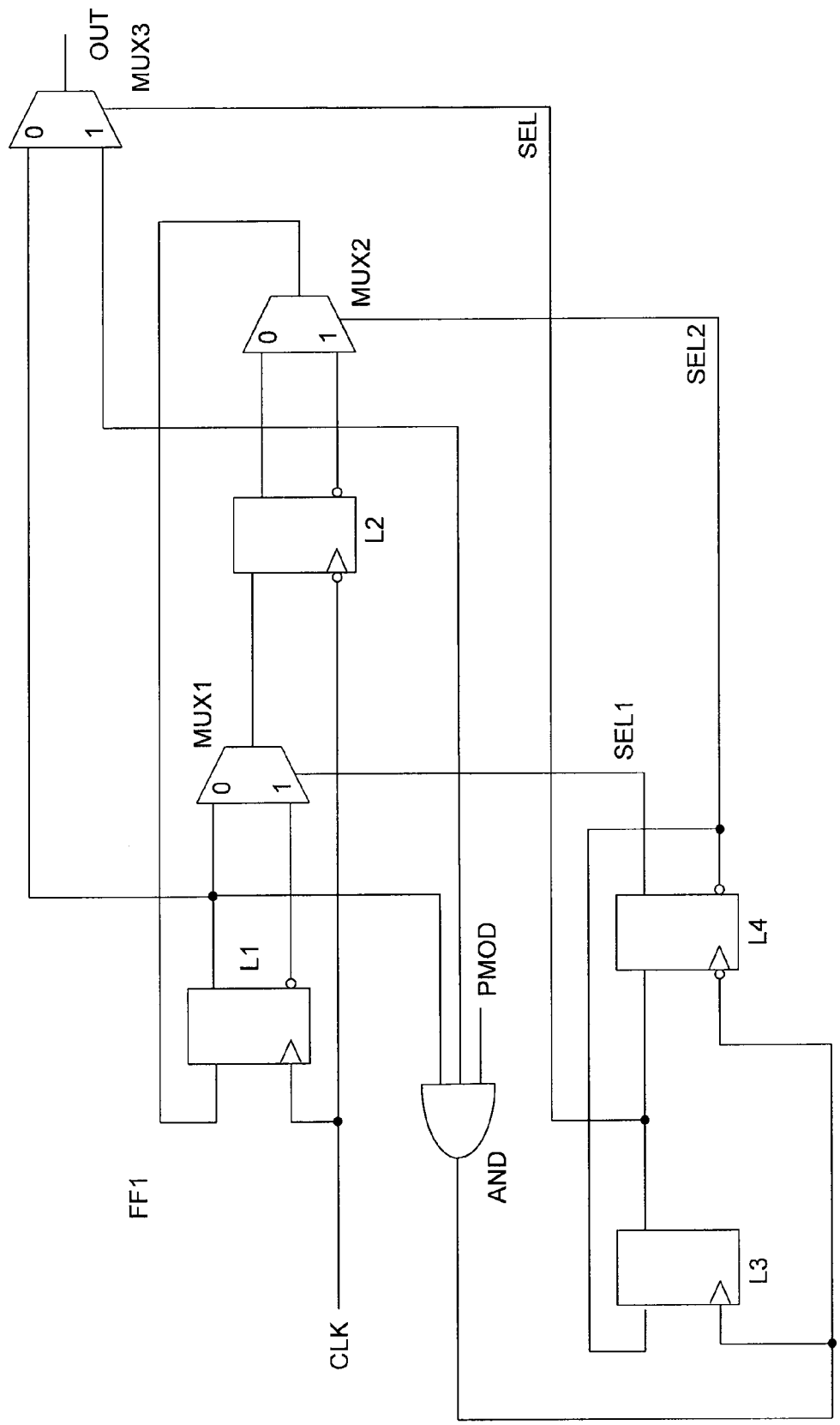
Figure 11E:
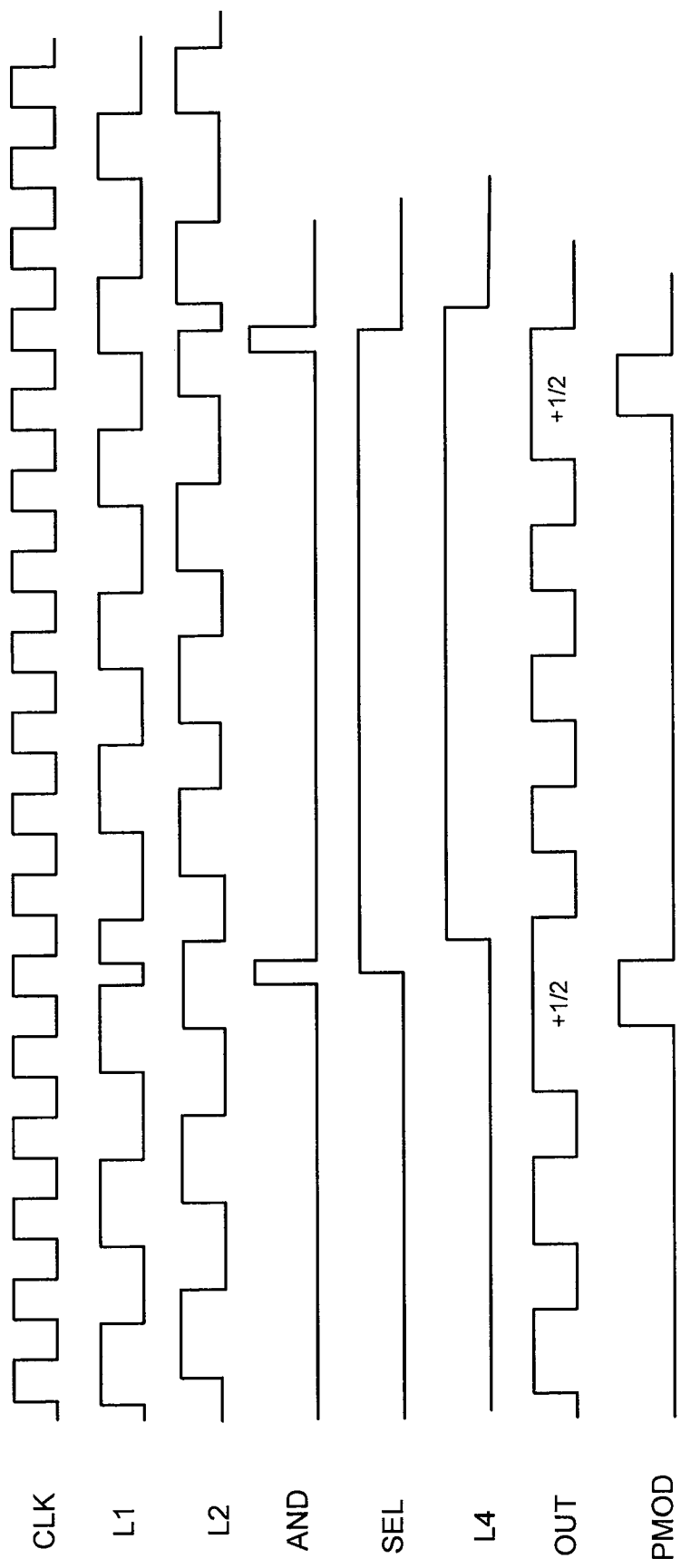

A variation on the prescalar front-end with 50% duty cycle is shown in FIG. 11d. It relies on a pair of divide-by-2 circuits and associated logic to add the half-cycle delay. Latches L1 and L2 form the primary divide-by-2 circuit that generates the normal output. Multiplexers MUX1 and MUX2 provide the requisite inverted feedback since select signals SEL1 and SEL2 are complimentary. The PMOD signal triggers the second divide-by-2 circuit (latches L3 and L4) to toggle the select signals (SEL, SEL1, and SEL2) when both outputs L1 and L2 are HI. This switches the output multiplexer MUX3 to follow the trailing signal (either L1 or L2), while it delays the other signal (that is, the leading signal) by one cycle—so that it now becomes the trailing signal. As a result, the output signal stays HI an extra half-cycle whenever PMOD pulses HI as shown in FIG. 11e.

The output of the prescalar front-end drives multiple divide-by-2 stages that form the A and B counters. The half-cycle delay permits the prescalar to generate an output signal triggered by either edge of the VCO—even for odd values of P. The resynchronization flip-flop aligns the output signal to the input clock signal and thereby removes the delay variation of the prescalar to reduce system phase noise. The PMOD signal depends on the value of P—it's pulsed for each sequence of the prescalar when P is odd (to achieve the half-cycle delay).

Figure 12A:
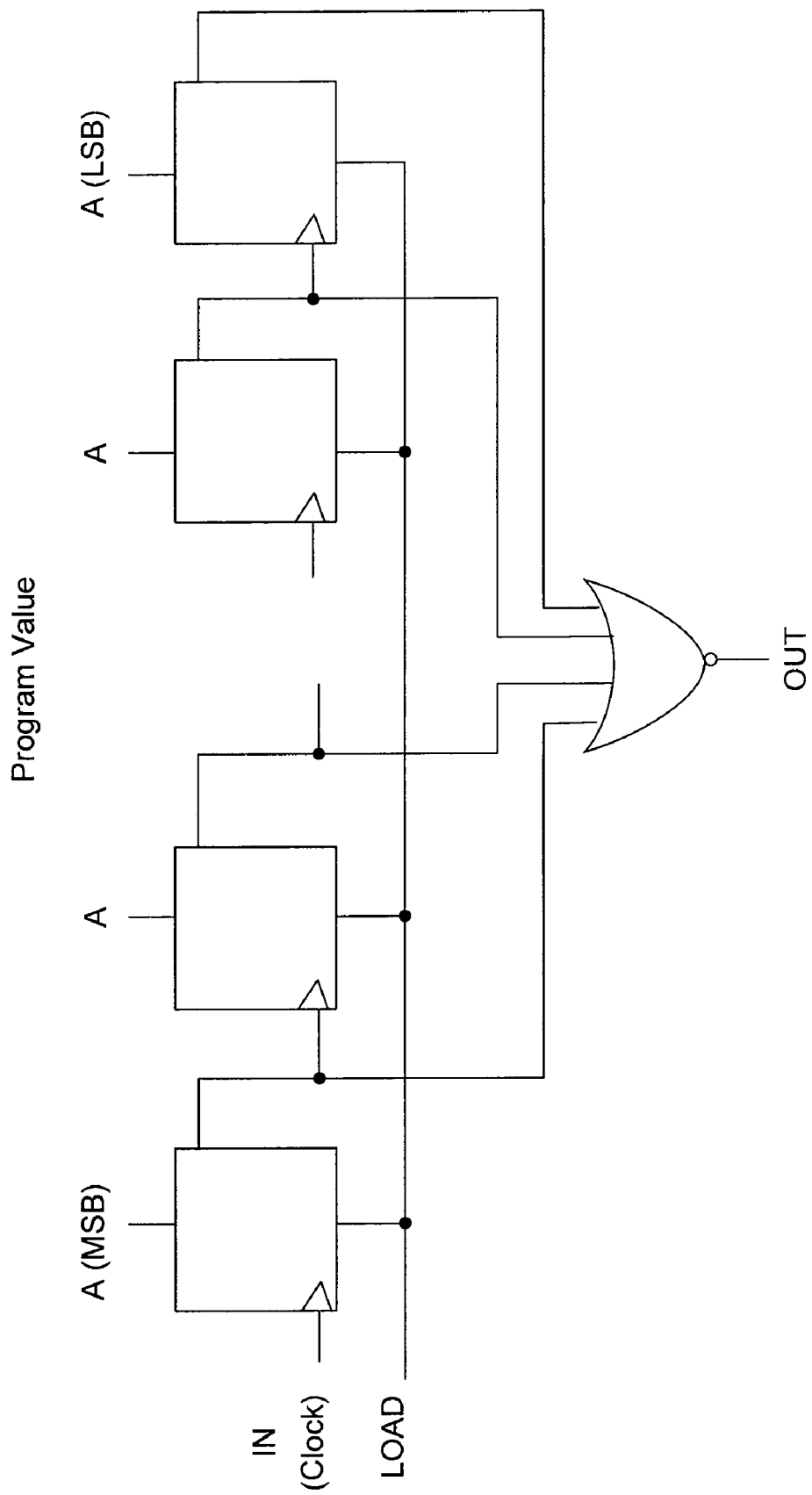
FIG. 12 shows a detailed diagram of a modified A counter that operates at A/2 loop in accordance with the present invention.
Figure 12B:
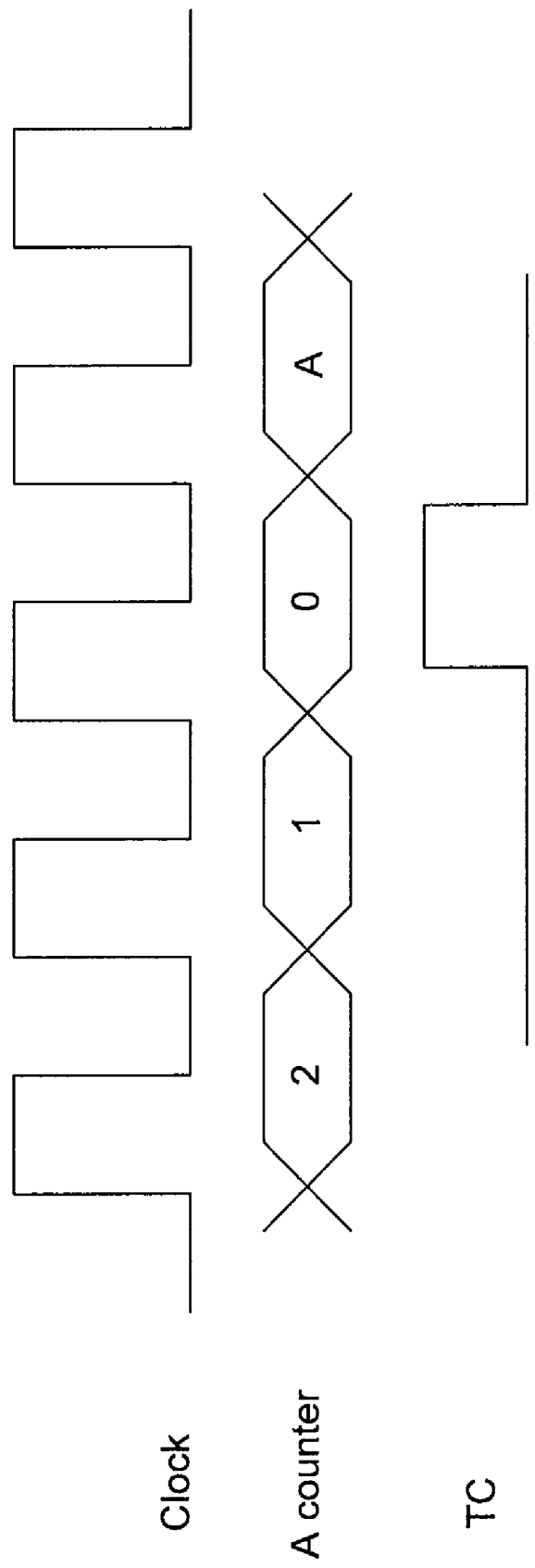

The A and B counters typically consist of programmable flip-flops that decrement to zero such as the one shown in FIG. 12a. The NOR gate decodes this all-zero condition—referred to as the terminal count (TC)—and produces an output pulse as shown in FIG. 12b. The load signal then sets the counter to the value A to repeat the process. Note that a flip-flop can be added to the output for resynchronization.

Figure 12C:
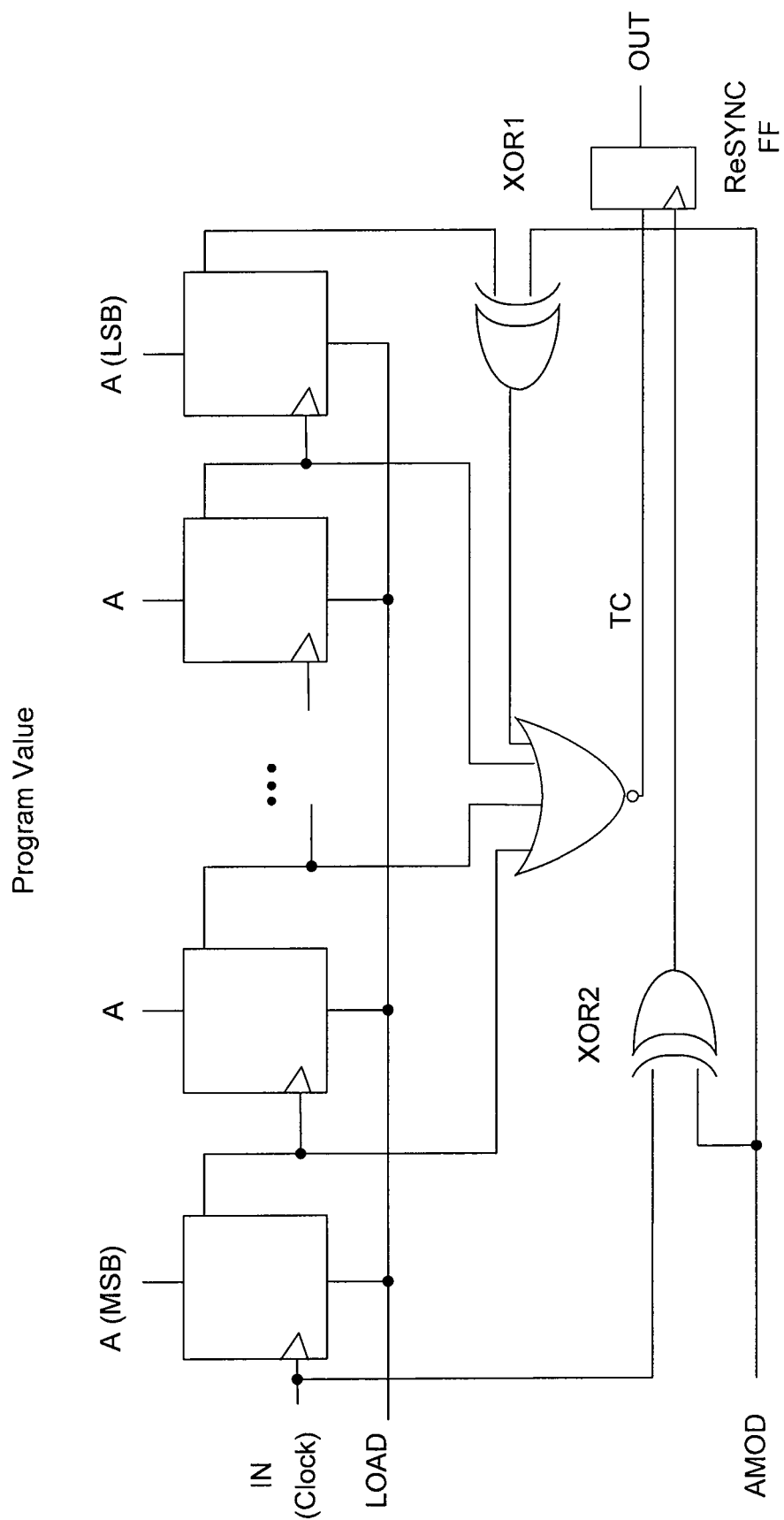
Figure 12D:
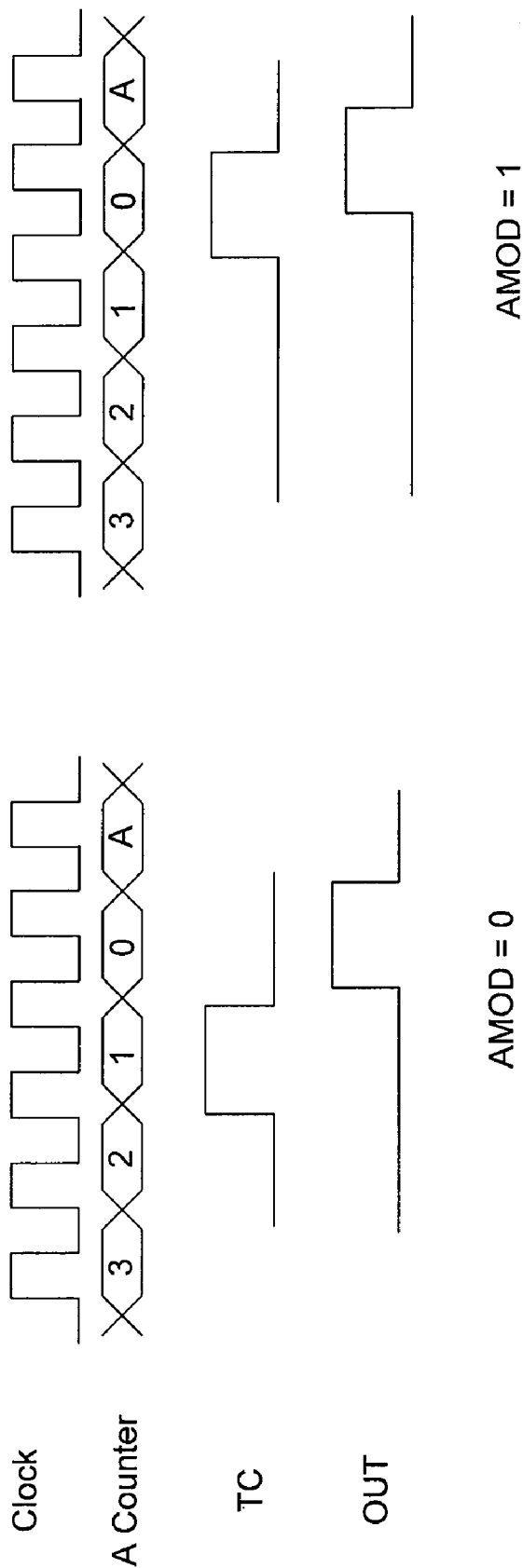

A modified counter capable of triggering off either clock edge (prescalar output) is shown in FIG. 12c. The gate XOR1 modifies the terminal count (TC) to occur at either 0 (AMOD is low) or 1 (AMOD is high). Simultaneously, the gate XOR2 inverts the clock input when AMOD is HI to delay the output signal one-half clock cycle as shown in FIG. 12d. Again, a resynchronization flip-flip aligns the output edge to the input clock edge. Although illustrated for the A counter, the same approach is also valid for the B counter.

Using both clock edges makes the system more complicated and requires a control circuit to track the active edge for the A and B counters. With both A and B even, the leading edge always resynchronizes the output as expected. With only A odd, resynchronization always occurs on the trailing edge to create the half-cycle delay. This is because the B counter starts and terminates on the leading edge. Since the A counter starts at the same instant as the B counter, the trailing edge always corresponds to a half-cycle delay. With only B odd, a simple control circuit toggles the active edge of both the A and B resynchronization flip-flops. This happens because the start time of the B counter (and consequently, the A counter) alternates between the leading and trailing edges. With both A and B odd, the control circuit toggles only the B counter resynchronization signal. The behavior of this control circuit is summarized in Table 1 and is implemented with some simple, low-speed logic.

Figure 13A:
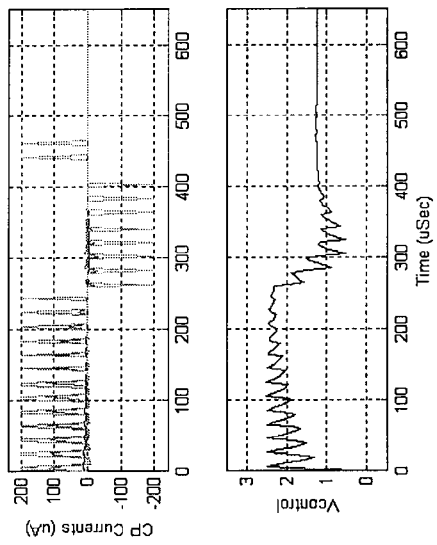
FIG. 13 shows the time response of a PLL with the N/2 counter.
Figure 13B:
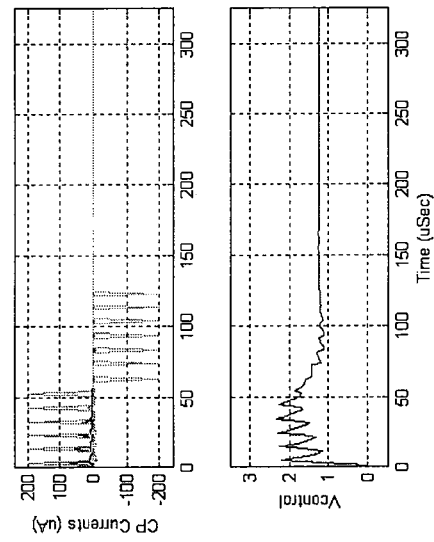

FIGS. 13a and 13b respectively illustrate the PLL settling response with a typical phase/frequency detector and with the innovative PLL system designed for dual-edge sensitivity. The acquisition time is literally halved by the modifications to the feedback counter and phase/frequency detector. In effect, detecting both edges of the VCO signal reduces N to $$N' = \frac{A}{2}\left[P + 2\left(\frac{1}{2}\right)\right] + \left(\frac{B}{2} - \frac{A}{2}\right)P$$

which simplifies to $$N = \frac{B}{2}P + \frac{A}{2}$$

The foregoing description, for purposes of explanation, used specific nomenclature to provide a thorough understanding of the invention. However, it will be apparent to one skilled in the art that the specific details are not required in order to practice the invention. In other instances, well-known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the following Claims and their equivalents define the scope of the invention.

What is claimed is:

1. A divider apparatus for use within a phase-locked loop having an output terminal at which an output frequency is produced, the apparatus comprising:
   a prescalar circuit configured to produce a prescaled signal by dividing the output frequency in accordance with a defined divider value, the prescalar circuit including at least a resynchronization element and a prescalar front-end configured to generate an intermediate signal characterized by a 50% duty cycle;
   a first programmable counter disposed to receive the prescaled signal, said first programmable counter characterized by a first effective program counter value of A/2, wherein A comprises an integral value;
   a second programmable counter disposed to receive the prescaled signal and to produce a divided signal utilized within the phase-locked loop, said second programmable counter characterized by a second effective program counter value of B/2, wherein B comprises an integral value; and
   a control circuit connected to the first programmable counter and to the second programmable counter wherein the control circuit generates, when A comprises an odd value and B comprises an even value, a first resynchronization signal causing resynchronization of the first programmable counter with respect to a trailing edge of the waveform defining the prescaled signal and a second resynchronization signal causing resynchronization of the second programmable counter with respect to a leading edge of the waveform.

2. A divider apparatus for use within a phase-locked loop having an output terminal at which an output frequency is produced, the apparatus comprising:
   a prescalar circuit configured to produce a prescaled signal by dividing the output frequency in accordance with a defined divider value, the prescalar circuit including at least a resynchronization element and a prescalar front-end configured to generate an intermediate signal characterized by a 50% duty cycle;
   a first programmable counter disposed to receive the prescaled signal, said first programmable counter characterized by a first effective program counter value of A/2, wherein A comprises an integral value;
   a second programmable counter disposed to receive the prescaled signal and to produce a divided signal utilized within the phase-locked loop, said second programmable counter characterized by a second effective program counter value of B/2, wherein B comprises an integral value; and
   a control circuit connected to the first programmable counter and to the second programmable counter, the control circuit providing a sequence of first resynchronization signals to the first programmable counter and a sequence of second resynchronization signals to the second programmable counter wherein successive ones of the first resynchronization signals result in the first programmable counter being resynchronized alternately with respect to leading and trailing edges of a waveform defining the prescaled signal when A is comprised of an even value and B is comprised of an odd value.

3. The apparatus of claim 2 wherein successive ones of the second resynchronization signals result in the second programmable counter being resynchronized alternately with respect to trailing and leading edges of the waveform.

4. In a phase-locked loop having an output terminal at which an output frequency is produced, a signal frequency division method comprising:
   dividing the output frequency in accordance with a defined divider value so as to produce a prescaled signal, wherein the dividing includes generating, in accordance with a mode select signal, an intermediate signal characterized by a 50% duty cycle,
   generating the mode select signal based upon the prescaled signal, wherein the generating the mode select signal is effected using a first programmable counter characterized by a first effective program counter value of A/2 wherein A comprises an integral value;
   performing counting operations using the prescaled signal so as to produce a divided signal utilized within the phase-locked loop, wherein the performing counting operations using the prescaled signal is effected using a second programmable counter characterized by a second effective program counter value of B/2 wherein B comprises an integral value; and
   resynchronizing, when A comprises an odd value and B comprises an even value, the first programmable counter with respect to a trailing edge of the waveform defining the prescaled signal and the second programmable counter with respect to a leading edge of the waveform.

5. In a phase-locked loop having an output terminal at which an output frequency is produced, a signal frequency division method comprising:
   dividing the output frequency in accordance with a defined divider value so as to produce a prescaled signal, wherein the dividing includes generating, in accordance with a mode select signal, an intermediate signal characterized by a 50% duty cycle;
   generating the mode select signal based upon the prescaled signal, wherein the generating the mode select signal is effected using a first programmable counter characterized by a first effective program counter value of A/2 wherein A comprises an integral value;
   performing counting operations using the prescaled signal so as to produce a divided signal utilized within the phase-locked loop, wherein the performing counting operations using the prescaled signal is effected using a second programmable counter characterized by a second effective program counter value of B/2 wherein B comprises an integral value; and
   alternately resynchronizing, when A is comprised of an even value and B is comprised of an odd value, the first programmable counter with respect to leading and trailing edges of a waveform defining the prescaled signal and the second programmable counter with respect to trailing and leading edges of the waveform.

6. A phase-locked loop module, comprising:
   a voltage-controlled oscillator for generating an output signal of a frequency determined by a control voltage;
   a divider circuit for dividing the output signal to produce a frequency-divided signal, the divider including a prescalar circuit configured to produce a prescaled signal by dividing the frequency of the output signal, a first programmable counter and a second programmable counter connected to the output of the prescalar circuit, and a control circuit operatively coupled to the first programmable counter and the second programmable counter, wherein the first programmable counter is characterized by a first effective program counter value of A/2 and the second programmable counter is characterized by a second effective program counter value of B/2 wherein each of A and B may comprise an odd or even integral value, and wherein the control circuit is configured to provide a first resynchronization signal to the first programmable counter and a second resynchronization signal to the second programmable counter, and wherein, when A comprises an odd value and B comprises an even value, the first resynchronization signal results in resynchronization of the first programmable counter with respect to a trailing edge of a waveform defining the prescaled signal and the second resynchronization signal results in resynchronization of the second programmable counter with respect to a leading edge of the waveform;
   a phase/frequency detector disposed to compare phases between an input reference signal and the frequency-divided signal and to produce a phase error signal;
   a charge pump circuit for producing a charge pump signal in response to the phase error signal; and
   a loop filter which produces the control voltage in response to the charge pump signal.

7. A phase-locked loop module, comprising:
   a voltage-controlled oscillator for generating an output signal of a frequency determined by a control voltage;
   a divider circuit for dividing the output signal to produce a frequency-divided signal, the divider including a prescalar circuit configured to produce a prescaled signal by dividing the frequency of the output signal, a first programmable counter and a second programmable counter connected to the output of the prescalar circuit, and a control circuit operatively coupled to the first programmable counter and the second programmable counter, wherein the first programmable counter is characterized by a first effective program counter value of A/2 and the second programmable counter is characterized by a second effective program counter value of B/2 wherein each of A and B may comprise an odd or even integral value, and wherein the control circuit is configured to provide a first resynchronization signal to the first programmable counter and a second resynchronization signal to the second programmable counter and wherein the control circuit further provides, when A is comprised of an even value and B is comprised of an odd value, a sequence of first resynchronization signals to the first programmable counter and a sequence of second resynchronization signals to the second programmable counter wherein successive ones of the first resynchronization signals result in the first programmable counter being resynchronized alternately with respect to leading and trailing edges of a waveform defining the prescaled signal;
   a phase/frequency detector disposed to compare phases between an input reference signal and the frequency-divided signal and to produce a phase error signal;
   a charge pump circuit for producing a charge pump signal in response to the phase error signal; and
   a loop filter which produces the control voltage in response to the charge pump signal.

* * * * *